(12) United States Patent
Chen (10) Patent No.: US 7,995,775 B2
(45) Date of Patent: Aug. 9, 2011

(54) AUTOMATIC VOLUME CONTROL FOR AUDIO SIGNALS

(75) Inventor: Juin-Hwey Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1070 days.

(21) Appl. No.: 11/773,142

(22) Filed: Jul. 3, 2007

(65) Prior Publication Data

US 2008/0013745 A1   Jan. 17, 2008

Related U.S. Application Data

(60) Provisional application No. 60/830,611, filed on Jul. 14, 2006.

(51) Int. Cl.
*H03G 3/00* (2006.01)
*H03G 3/20* (2006.01)

(52) U.S. Cl. .......................................... 381/107; 381/57

(58) Field of Classification Search .................. 381/107, 381/104, 56, 57
See application file for complete search history.

(56) References Cited

U.S. PATENT DOCUMENTS

| | | | | |
|---|---|---|---|---|
| 5,905,802 A | * | 5/1999 | Megeid | 381/108 |
| 6,044,108 A | * | 3/2000 | Bertness et al. | 375/222 |
| 6,195,438 B1 | * | 2/2001 | Yumoto et al. | 381/103 |
| 6,636,609 B1 | * | 10/2003 | Ha et al. | 381/104 |
| 7,403,627 B2 | * | 7/2008 | Wu | 381/106 |
| 7,469,208 B1 | * | 12/2008 | Kincaid | 704/224 |
| 7,551,745 B2 | * | 6/2009 | Gundry et al. | 381/106 |
| 2002/0090096 A1 | * | 7/2002 | Blind et al. | 381/104 |
| 2007/0121966 A1 | * | 5/2007 | Plastina et al. | 381/104 |
| 2010/0166225 A1 | * | 7/2010 | Watanabe et al. | 381/107 |
| 2010/0226510 A1 | * | 9/2010 | Kikugawa | 381/107 |

* cited by examiner

*Primary Examiner* — Curtis Kuntz
*Assistant Examiner* — Hai Phan
(74) *Attorney, Agent, or Firm* — Fiala & Weaver P.L.L.C.

(57) ABSTRACT

A technique is provided for automatically adjusting the volume, or magnitude, of an audio signal. The technique includes calculating an average power associated with a segment of an input audio signal, determining whether the average power is greater than an estimated signal level associated with one or more previously-processed segments of the input audio signal and, depending on the determination, either calculating an updated estimated signal level by subtracting from the average power an attenuated difference between the estimated signal level and the average power or setting the updated estimated signal level to the average power. A gain to be applied to the segment of the input audio signal is then determined based on the updated estimated signal level and a target signal level for an output audio signal.

33 Claims, 9 Drawing Sheets

AUTOMATIC VOLUME CONTROL FOR AUDIO SIGNALS

CROSS-REFERENCE TO RELATED APPLICATIONS

This application claims priority to U.S. Provisional Patent Application No. 60/830,611, entitled "Automatic Volume Control for Audio Signals" and filed on Jul. 14, 2006, the entirety of which is incorporated by reference herein.

BACKGROUND OF THE INVENTION

1. Field of the Invention

The invention generally relates to systems that are configured to receive audio signals and play them back to a user.

2. Background

Many conventional consumer electronic devices provide a user with the ability to switch between multiple input audio sources, each of which may have a different audio signal level. Such devices may include but are not limited to television sets, cable set-top boxes, satellite set-top boxes, and preamplifiers and receivers in home stereo systems or home theater systems. If, after switching the input audio source, a difference between the signal level of the previous input audio source and the new input audio source is not compensated for, the user may be required to manually adjust the volume at which the output audio signal is played back. This can be a nuisance if such switching is frequent. A similar issue also arises for devices that allow a user to switch between different television channels, each of which may have a different audio signal level.

Consumers may also be annoyed by television commercials that are considerably louder than regular television shows. When such a commercial is aired, a user may be compelled to manually adjust the volume of their television set or cable/satellite set-top box to minimize a difference in loudness between the commercial and the television show.

What is needed, then, is a technique for automatically adjusting the volume, or magnitude, of an audio signal. The desired technique should be applicable to reduce a difference in signal levels between two different input audio sources, between two different television channels, and/or between a television program and a commercial.

BRIEF SUMMARY OF THE INVENTION

The present invention provides a technique for automatically adjusting the volume, or magnitude, of an audio signal. The invention may be used, for example, to reduce a difference in signal levels between two different input audio sources, between two different television channels, and/or between a television program and a commercial.

In particular, a method for automatically adjusting the volume of an audio signal in accordance with an embodiment of the present invention is provided. In accordance with the method, an average power associated with a segment of an input audio signal is calculated. A determination is made as to whether the average power is greater than an estimated signal level associated with one or more previously-processed segments of the input audio signal. Responsive to a determination that the average power is not greater than the estimated signal level, an updated estimated signal level is calculated by subtracting from the average power an attenuated difference between the estimated signal level and the average power. Responsive to a determination that the average power is greater than the estimated signal level, the updated estimated signal level is set equal to the average power. A gain to be applied to the segment of the input audio signal is then determined based on the updated estimated signal level and a target signal level for an output audio signal.

In accordance with the foregoing method, calculating an average power associated with a segment of the input audio signal may include calculating an average power associated with a single frame of the input audio signal. Calculating an average power associated with a single frame of the input audio signal may include calculating an average power associated only with subframes within the single frame of the input audio signal that are determined to be active. The method may further include determining which subframes within the single frame of the input audio signal are active by comparing a signal energy associated with each subframe to a power threshold. The method may still further include adaptively adjusting the power threshold responsive to a change in the level of the input audio signal.

In accordance with the foregoing method, calculating an average power associated with a segment of the audio signal may alternatively include calculating an average power associated with a plurality of frames of the input audio signal. Calculating an average power associated with a plurality of frames of the input audio signal may include calculating an average power associated only with samples that are determined to be active within the plurality of frames of the input audio signal.

The foregoing method may further include determining if the average power exceeds a power threshold and, responsive to determining that the average power does not exceed the power threshold, determining the gain to be applied to the segment of the input audio signal based on the estimated signal level associated with the one or more previously-processed segments of the input audio signal and the target signal level for an output audio signal. The method may also include adaptively adjusting the power threshold responsive to a change in the level of the input audio signal.

The foregoing method may also include generating a series of gain values that transition from the gain associated with the previously-processed segment of the input audio signal to the determined gain and applying the series of gain values to the segment of the input audio signal. Generating a series of gain values may include generating a series of gain values that transition from the gain associated with the previously-processed segment of the input audio signal to the determined gain in a first time period responsive to a determination that the average power is less than or equal to the estimated signal level, and generating a series of gain values that transition from the gain associated with the previously-processed segment of the input audio signal to the determined gain in a second time period responsive to a determination that the average power is greater than the estimated signal level, wherein the first time period is longer than the second time period.

Also provided herein are systems in accordance with various embodiments of the present invention that are configured to perform the foregoing methods. Computer program products in accordance with various embodiments of the present invention are also described herein, the computer program products comprising a computer-readable medium having computer program logic recorded thereon for enabling a processor to perform the foregoing methods.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

Figure 1:
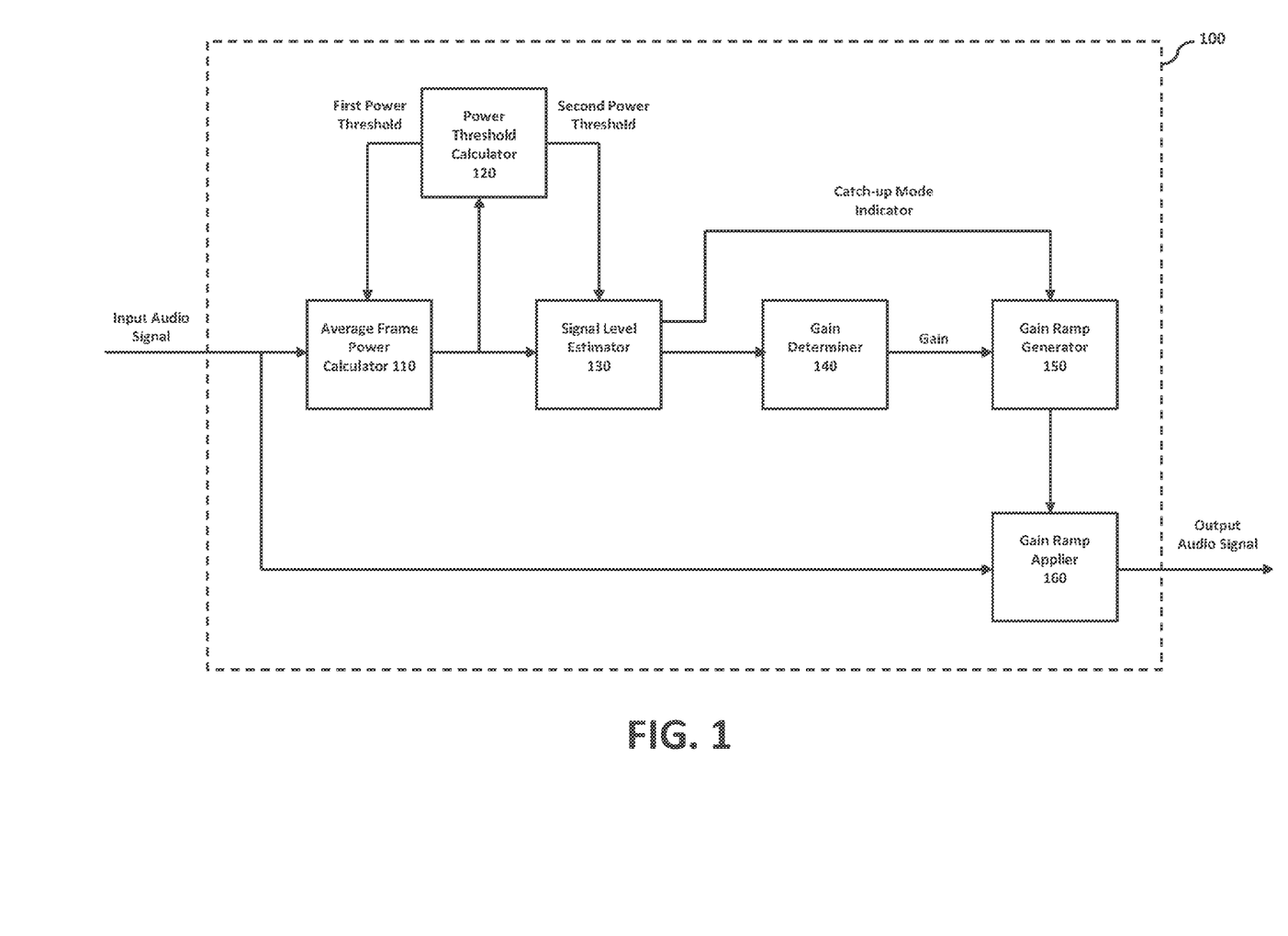
FIG. 1 is a block diagram of a system that automatically controls the volume of an input audio signal in accordance with an embodiment of the present invention.

A. System and Method for Automatic Volume Control in Accordance with an Embodiment of the Present Invention FIG. 1 is a block diagram of a system 100 that automatically controls the volume of an input audio signal in accordance with an embodiment of the present invention. As shown in FIG. 1, system 100 includes an average frame power calculator 110, a power threshold calculator 120, a signal level estimator 130, a gain determiner 140, a gain ramp generator 150, and a gain ramp applier 160. As will be readily appreciated by persons skilled in the relevant art(s), each of the elements of system 100 may be implemented as software, as hardware, or as a combination of software and hardware. In one embodiment of the present invention, each of the elements of system 100 is implemented as a series of software instructions that, when executed by a digital signal processor (DSP), perform the functions of that element as described herein.

In general, system 100 operates to adjust the volume, or magnitude, of a received input audio signal to produce an output audio signal for playback to a user. Each of the elements of system 100 is configured to operate on discrete groups of consecutive audio samples which are termed frames. The size of each frame may be, for example, in the range of 5 milliseconds (ms) to 20 ms, although this example is not intended to be limiting. The number of samples in each frame is dependent upon the sampling rate. As used herein, the term "current frame" will be used to refer to a frame of the input audio signal that system 100 is currently processing, whereas the term "previous frame" will be used to refer to a frame of the input audio signal that system 100 has already processed and output as a portion of the output audio signal. The operation of each of the elements of system 100 will now be described in more detail.

As shown in FIG. 1, the input audio signal is received both by average frame power calculator 110 and gain ramp applier 160. Average frame power calculator 110 is configured to receive the current frame of the input audio signal and to calculate an average frame power based on a certain portion of the input audio signal in the current frame. In particular, average frame power calculator 110 is configured to identify a portion of the input audio signal in the current frame that exceeds a first power threshold provided by power threshold calculator 120. This identified portion may be thought of as the active portion of the current frame. Average frame power calculator 110 is further configured to calculate an average frame power for the current frame based on only this identified portion.

One reason for calculating the average frame power based only upon active portions of the input audio signal is that if a strong and sudden onset of an active signal occurs near the end of the current frame, then averaging the power of the input audio signal over the entire frame will produce an average power that is much smaller than the average power of the active portion of the signal. This can result in system 100 not being able to scale down the input audio signal sufficiently during the first active frame of a strong and sudden onset, thus producing an output audio signal that sounds louder than it should during the first frame of onset.

Power threshold calculator 120 is configured to calculate the first power threshold based upon average frame power information provided by average frame power calculator 110 with respect to previous frames of the input audio signal. In particular, power threshold calculator 120 is configured to adaptively adjust this first power threshold so that it can track a change in a long-term average of the audio input signal level. Such a change may occur, for example, after switching from a first input audio source to a second input audio source, after switching from a first television channel to a second television channel, or when transitioning between a television program and a commercial.

Signal level estimator 130 is configured to estimate a long-term signal level of the input audio signal using the average frame power of the current frame provided by average frame power calculator 110 and a second power threshold calculated by power threshold calculator 120. Note that the second power threshold may be the same as the first power threshold, or different. In particular, signal level estimator 130 is configured to compare the average frame power of the current frame to the second power threshold. If signal level estimator 130 determines that the average frame power of the current frame is less than or equal to the second power threshold, then the current frame is deemed inactive and signal level estimator 130 will not update an estimate of the long-term signal level of the input audio signal. This has the effect of "freezing" the system gain (also referred to herein as a scaling factor) so that system 100 will not adapt toward a prolonged silence or low-level background noise and thus mistakenly boost the signal level of such inactive regions gradually.

However, if signal level estimator 130 determines that the average frame power of the current frame is greater than the second power threshold, then the signal is deemed active and signal level estimator 130 updates the estimate of the long-term signal level of the input audio signal. The manner in which signal level estimator 130 updates this estimate will now be described.

First, signal level estimator 130 compares the average frame power of the current frame provided by average frame power calculator 110 to the estimated long-term signal level associated with a previous frame. If the average frame power of the current frame is less than or equal to the estimated long-term signal level associated with the previous frame, signal level estimator 130 sets a catch-up mode indicator to "off" and updates the estimated long-term signal level using a running average of average frame power information provided by average frame power calculator 110.

If, on the other hand, the average frame power of the current frame exceeds the estimated long-term signal level associated with the previous frame, then system 100 is deemed to be in a catch-up mode. In this case, signal level estimator 130 sets the catch-up mode indicator to "on" and sets the estimated long-term signal level to be the same as the average frame power of the current frame. These operations enable system 100 to quickly suppress a sudden increase in the level of the input audio signal. Such a sudden increase may occur, for example, during a transition from a television program to a commercial.

Gain determiner 140 is configured to compare the estimated long-term signal level calculated by signal level estimator 130 with a target signal level for the output audio signal of system 100. Gain determiner 140 is further configured to determine a scaling factor, or gain, that system 100 must apply to the input audio signal in the current frame in order to scale the input audio signal in the current frame to the target signal level. This determination is made based in part upon the comparison between the estimated long-term signal level and the target signal level.

If the gain calculated by gain determiner 140 was applied to all of the samples of the input audio signal within the current frame, then there would likely be waveform discontinuities at the frame boundaries, which would be perceived during playback as audible clicks. To avoid such waveform discontinuities, the gain needs to be gradually "ramped up" or "ramped down" from the gain associated with the previous frame processed by system 100 to the gain associated with the current frame. To achieve this, system 100 uses a "gain ramp." As used herein, the term gain ramp refers to a series of increasing or decreasing gain values that are to be multiplied by corresponding samples of the current frame on a sample-by-sample basis. The gain ramp is generated by gain ramp generator 150.

Gain ramp generator 150 is configured such that the shape of the gain ramp generated depends on which mode the system is in. In particular, gain ramp generator 150 is configured such that, if signal level estimator 130 sets the catch-up mode indicator to "off," a slow gain ramp is generated that gradually ramps up or down from the gain associated with the previously-processed frame to the gain associated with the current frame over the course of most or all of an entire frame. For example, if the frame size is 20 ms, the slow gain ramp may start at the beginning of the frame and span all or most of the 20 ms of the frame. If, on the other hand, signal level estimator 130 sets the catch-up mode indicator to "on," then system 100 is in a catch-up mode and needs to very quickly suppress the input audio signal in the current frame. In this case, gain ramp generator 150 produces a fast gain ramp that ramps down from the gain associated with the previously-processed frame to the gain associated with the current frame over a very short time period. For example, if the frame size is 20 ms, the fast gain ramp may start at the beginning of the frame and ramp down to the current gain value in 1 ms or even 0.5 ms, and then remain at the current gain value for the remainder of the frame.

Gain ramp applier 160 is configured to receive the current frame of the input audio signal and to apply the gain ramp generated by gain ramp generator 150 thereto. The gain ramp is applied to the current frame by multiplying the gain ramp by the current frame on a sample-by-sample basis. The resulting scaled signal is the desired output signal of system 100.

The operation of system 100 during the processing of a single frame of the input audio signal will now be described with reference to flowchart 200 of FIG. 2. Although the method of flowchart 200 will be described herein with reference to the elements of system 100, persons skilled in the relevant art(s) will appreciate that the invention is not limited to that implementation and that other logical or physical structures may be used to perform the steps of flowchart 200.

Figure 2:
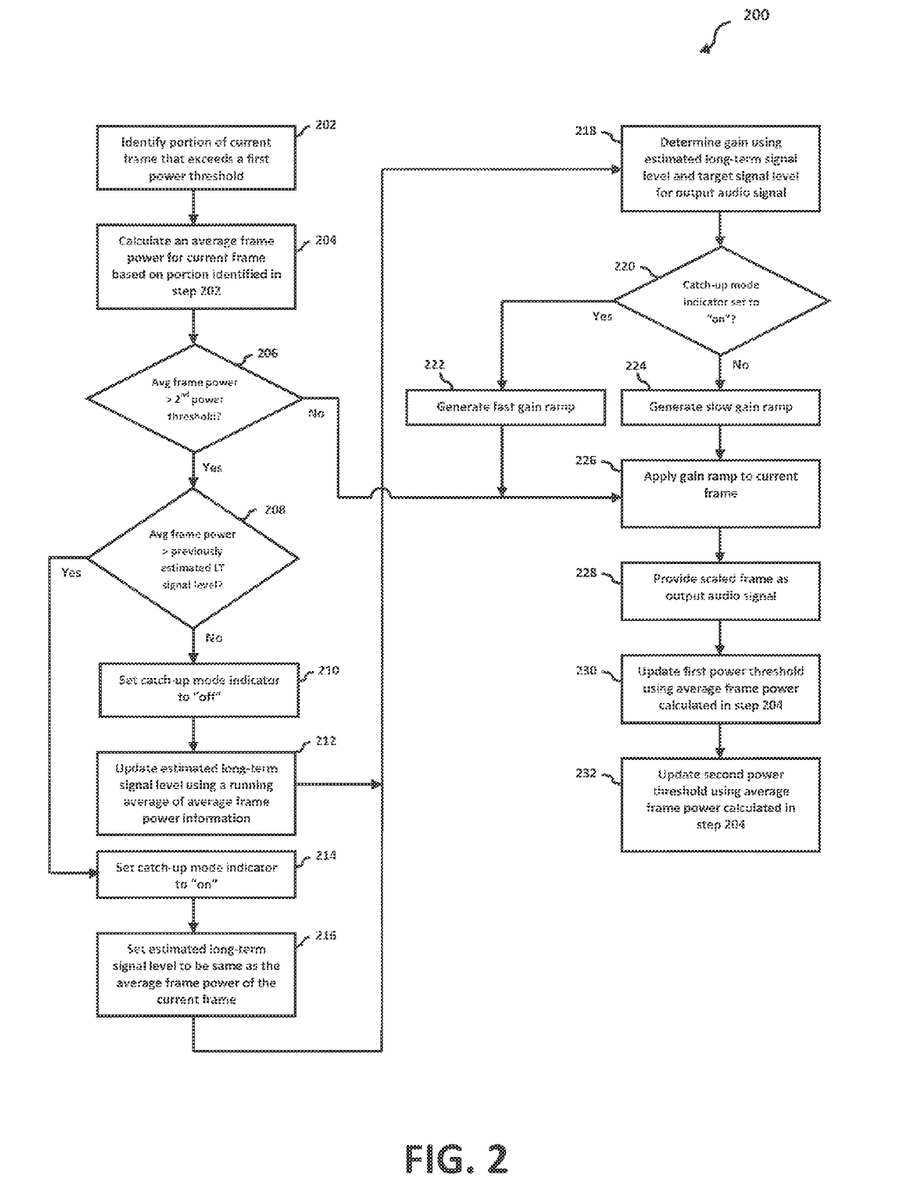
FIG. 2 depicts a flowchart of a method for automatically controlling the volume of an input audio signal in accordance with an embodiment of the present invention.

As shown in FIG. 2, the method of flowchart 200 begins at step 202, in which average frame power calculator 110 receives the current frame of the input audio signal and identifies a portion of the input audio signal in the current frame that exceeds the first power threshold provided by power threshold calculator 120. This identified portion may be thought of as the active portion of the current frame. At step 204, average frame power calculator 110 calculates an average frame power for the current frame based on the identified portion of the current frame.

At decision step 206, signal level estimator 130 compares the average frame power of the current frame provided by average frame power calculator 110 to the second power threshold provided by power threshold calculator 120. If the average frame power is less than or equal to the second power threshold, then the current frame is deemed inactive and signal level estimator 130 will not update an estimate of the long-term signal level of the input audio signal. As noted above, this has the effect of "freezing" the system gain so that system 100 will not adapt toward a prolonged silence or low-level background noise and thus mistakenly boost the signal level of such inactive regions gradually. Since signal level estimator 130 does not update the estimate of the long-term signal level of the input audio signal, processing proceeds directly to step 226, in which a gain ramp is applied to the current frame to generate the output audio signal. In this case, the gain ramp will be the gain ramp associated with the previously-processed frame of the input audio signal.

However, if signal level estimator 130 determines that the average power of the current frame is greater than the second power threshold, then the signal is deemed active and processing proceeds to decision step 208 to determine how the estimated long-term signal level is updated.

In particular, at decision step 208, signal level estimator 130 compares the average frame power of the current frame provided by average frame power calculator 110 to the estimated long-term signal level associated with a previous frame. If the average frame power of the current frame is less than or equal to the estimated long-term signal level associated with the previous frame, then processing proceeds to steps 210 and 212, in which signal level estimator 130 sets the catch-up mode indicator to "off" (step 210) and updates the estimated long-term signal level using a running average of average frame power information provided by average frame power calculator 110 (step 212). If, on the other hand, the average frame power of the current frame exceeds the estimated long-term signal level associated with the previous frame, then system 100 is deemed to be in a catch-up mode and processing instead proceeds to steps 214 and 216. During these steps, signal level estimator 130 sets the catch-up mode indicator to "on" (step 214) and sets the estimated long-term signal level to be the same as the average frame power of the current frame (step 216). These operations enable system 100 to quickly suppress a sudden increase in the level of the input audio signal.

After step 212 or step 216 is complete, processing then proceeds to step 218, in which gain determiner 140 determines a gain for the current frame using the estimated long-term signal level calculated by signal level estimator 130 and a target signal level for the output audio signal of system 100. In particular, gain determiner 140 determines a gain that system 100 must apply to the input audio signal in the current frame in order to scale the input audio signal in the current frame to the target signal level. This determination is made based in part upon the comparison between the estimated long-term signal level and the target signal level.

At decision step 220, gain ramp generator 150 determines if the catch-up mode indicator is set to "on" or "off." If the catch-up mode indicator is set to "off," processing proceeds to step 224 in which gain ramp generator 150 generates a slow gain ramp that gradually ramps up or down from the gain associated with the previously-processed frame to the gain associated with the current frame over the course of most or all of an entire frame. For example, if the frame size is 20 ms, the slow gain ramp may start at the beginning of the frame and span all or most of the 20 ms of the frame.

If, on the other hand, the catch-up mode indicator is set to "on," processing instead proceeds to step 222 in which gain ramp generator 150 generates a fast gain ramp that ramps down from the gain associated with the previously-processed frame to the gain associated with the current frame over a very short time period. For example, if the frame size is 20 ms, the fast gain ramp may start at the beginning of the frame and ramp down to the current gain value in 1 ms or even 0.5 ms, and then remain at the current gain value for the remainder of the frame.

After step 222 or 224 is complete, processing proceeds to step 226, in which gain ramp applier 160 applies the gain ramp generated by gain ramp generator 150 to the current frame of the input audio signal. The gain ramp is applied to the current frame by multiplying the gain ramp by the current frame on a sample-by-sample basis. At step 228, the resulting scaled signal is the provided as the output audio signal of system 100.

At step 230, power threshold calculator 120 updates the first power threshold based upon the average frame power calculated for the current frame by average frame power calculator 110. At step 232, power threshold calculator also updates the second power threshold based upon the average frame power calculated for the current frame by average frame power calculator 110. These values will then be used for the next frame of the input audio signal that will be processed by system 100.

B. First Example Implementation Details

A first manner of implementing system 100 of FIG. 1 will now be described. This first implementation is described by way of example only and is not intended to limit the present invention.

1. Average Frame Power Calculator 110

Figure 3:
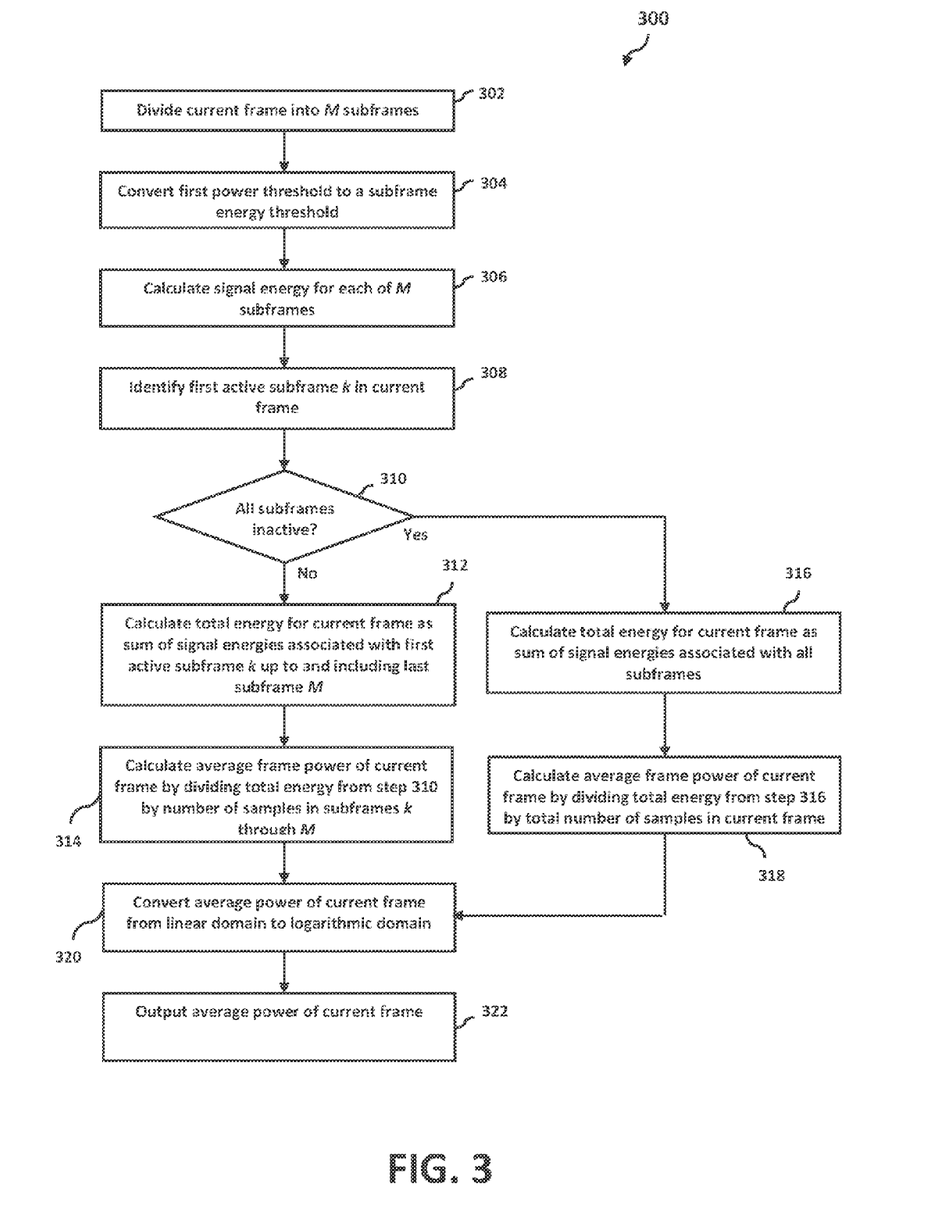
FIG. 3 depicts a flowchart of a method for calculating an average frame power in accordance with an embodiment of the present invention.

The manner in which average frame power calculator 110 operates in accordance with this first implementation of system 100 will now be described with reference to flowchart 300 of FIG. 3. At step 302, average frame power calculator 110 divides the current frame of the input audio signal into M subframes. For example, if the frame size is M milliseconds, then average frame power calculator 110 divides the current frame into M subframes, each of which is 1 ms long. In this case, for an example frame size of 16 ms, average frame power calculator 110 would divide the current frame into 16 subframes, each of which is 1 ms long.

At step 304, average frame power calculator 110 converts the first power threshold provided by power threshold calculator 120 to a subframe energy threshold for each of the M subframes by multiplying the first power threshold by the number of samples in each of the M subframes. The number of samples in each of the M subframes will depend on the sampling rate.

At step 306, average frame power calculator 110 calculates the energy of the input audio signal in each of the M subframes, which is referred to herein as the subframe signal energy. At step 308, average frame power calculator 110 searches for the first active subframe in the current frame by consecutively comparing the subframe signal energy associated with each subframe to the subframe energy threshold, starting with the first subframe in the current frame and progressing toward the last subframe in the current frame. The first subframe in the current frame that has a subframe signal energy that exceeds the subframe energy threshold is identified as the first active subframe. The first active subframe may be denoted subframe k, where k may be any integer from 1 to M.

At decision step 310, average frame power calculator 110 determines whether there are any active subframes within the current frame based on the search performed in step 308. If there are, then a total energy for the current frame is calculated as the sum of the subframe signal energies associated with the first active subframe k and all subsequent subframes up to an including the last subframe M, as shown at step 312. The average frame power is then calculated at step 314 by dividing the total energy calculated in step 312 by the total number of samples in subframe k through subframe M. The total number of samples in subframe k through subframe M will be equal to (M−k+1) times the number of input audio signal samples in each subframe.

However, in the degenerate case in which all subframes within the current frame are inactive, average frame power calculator 110 calculates the total energy for the current frame as the sum of the subframe signal energies associated with all the subframes in the current frame, as shown at step 316. The average frame power is then calculated at step 318 by dividing the total energy calculated in step 316 by the total number of samples in the current frame.

After the completion of step 314 or 318 (depending upon the outcome of decision step 310), processing then proceeds to step 320, in which average frame power calculator 110 converts the average frame power determined in either step 314 of 318 from the linear domain to the logarithmic domain. For example, let the average frame power calculated in step 314 or 318 be pwr. Then, the output of average frame power calculator may be calculated as the following logarithmic power value:

$$lg = 10 \log_{10}(pwr) - R$$

where $$R = 20 \log_{10}(MaxMag)$$

and MaxMag is the maximum magnitude that can be represented by the digital representation of each input audio signal sample. For a 16-bit PCM (pulse code modulated) representation of the input audio signal, MaxMag may be set to 32,768. The log-gain value lg calculated in this manner is considered to be the decibel (dB) value relative to digital full scale, also termed the dBFs value.

At step 322, average frame power calculator 110 outputs the log-gain value calculated in step 320 as the average frame power of the current frame. As noted above, the average frame power is used for performing operations by both power threshold calculator 120 and signal level estimator 130.

2. Power Threshold Calculator 120

The manner in which power threshold calculator 120 operates to update the first and second power thresholds in accordance with this first implementation of system 100 will now be described. Let lmax be a variable used to track the maximum log-gain output by average frame power calculator 110, let lmin be a variable used to track the minimum log-gain, and let lmean be a running average (or smoothed version) of the mid-point between lmax and lmin. Let alpha, alpha2, and beta be attenuation factors close to but slightly less than unity, which are used to update a running average (or smoothed version) of lmax, lmin, and lmean, respectively. Then, power threshold calculator 120 may be implemented using the algorithm depicted in flowchart 400 of FIG. 4.

Figure 4:
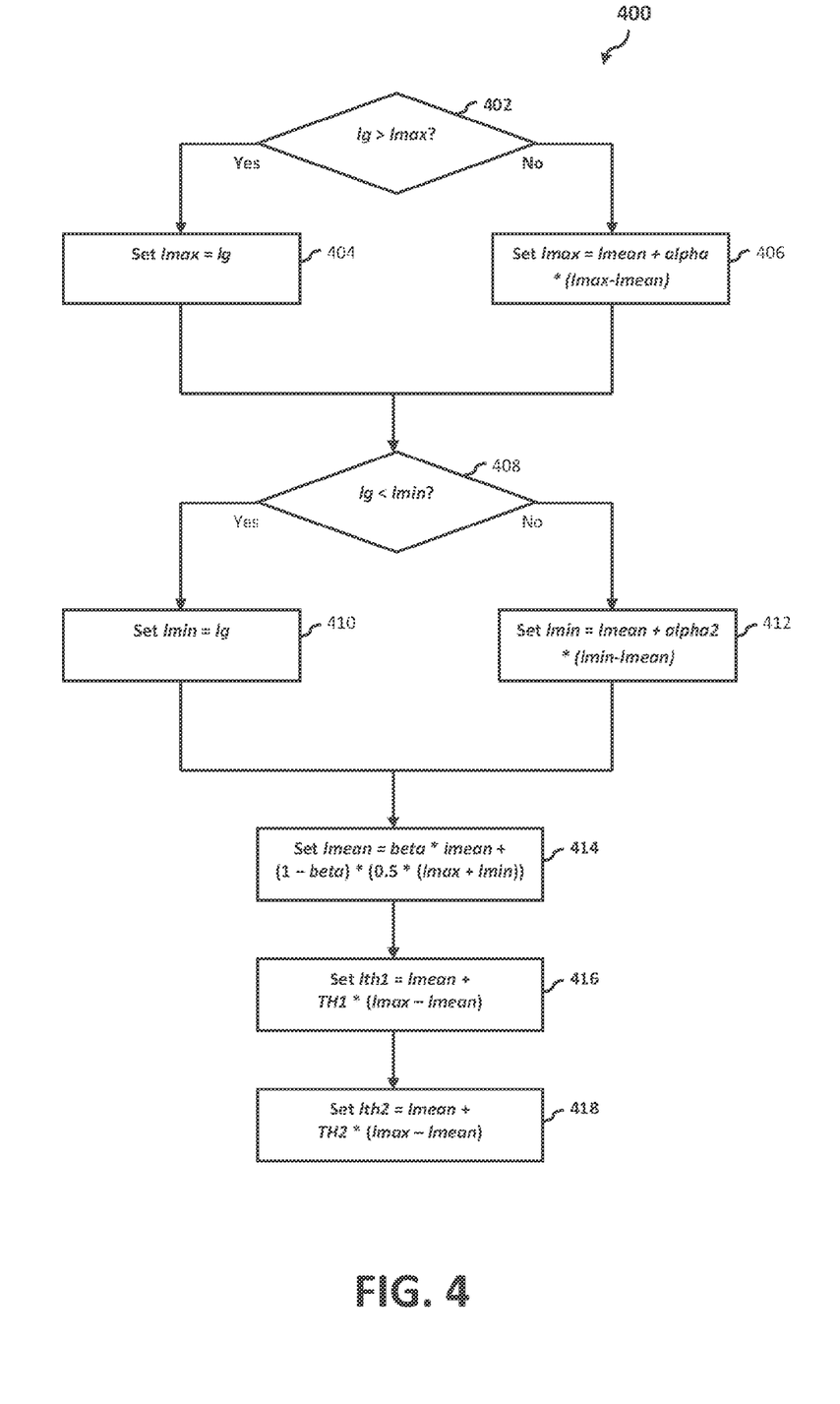
FIG. 4 depicts a flowchart of a method for updating first and second power thresholds in accordance with an embodiment of the present invention.

As shown in FIG. 4, the algorithm begins at decision step 402, in which power threshold calculator 120 determines whether lg is greater than lmax. If lg is greater than lmax, then power threshold calculator 120 sets lmax equal to lg, as shown at step 404. If, on the other hand, lg is not greater than lmax, then power threshold calculator 120 sets lmax equal to lmean+alpha*(lmax−lmean), as shown at step 406.

At decision step 408, power threshold calculator 120 determines whether lg is less than lmin. If lg is less than lmin, then power threshold calculator 120 sets lmin equal to lg, as shown at step 410. If, on the other hand, lg is not less than lmin, then power threshold calculator 120 sets lmin equal to lmean+alpha2*(lmin−lmean), as shown at step 412.

At step 414, power threshold calculator 120 sets lmean equal to beta*lmean+(1−beta)*(0.5*(lmax+lmean)). At step 416, power threshold calculator 120 sets the first log-gain power threshold, lg1, equal to lmean+TH1*(lmax−lmean). At step 418, power threshold calculator 120 sets the second log-gain power threshold, lg2, equal to lmean+TH2*(lmax−lmean).

Exemplary parameter values for the foregoing algorithm are alpha=1023/104, alpha2=32,767/32,768, beta=63/64, TH1=0, and TH2=0.3. Before system 100 of FIG. 1 starts up, the variables lmax, lmin, and lmean should be initialized to appropriate initial values which represent their steady-state values for typical input audio signals.

In this particular implementation, the first log-gain threshold lth1 is converted back to the linear domain before being used as the first power threshold by average frame power calculator 110. On the other hand, the second log-gain threshold lth2 is directly used as the second power threshold by signal level estimator 130.

3. Signal Level Estimator 130

The manner in which signal level estimator 130 operates to calculate an estimated long term signal level in accordance with this first implementation of system 100 will now be described. Let ol be the output signal level estimated by signal level estimator 130. When system 100 of FIG. 1 starts up, the value of ol is initialized to the target output level of system 100 after volume control. Signal level estimator 130 may then be implemented using the algorithm depicted in flowchart 500 of FIG. 5.

Figure 5:
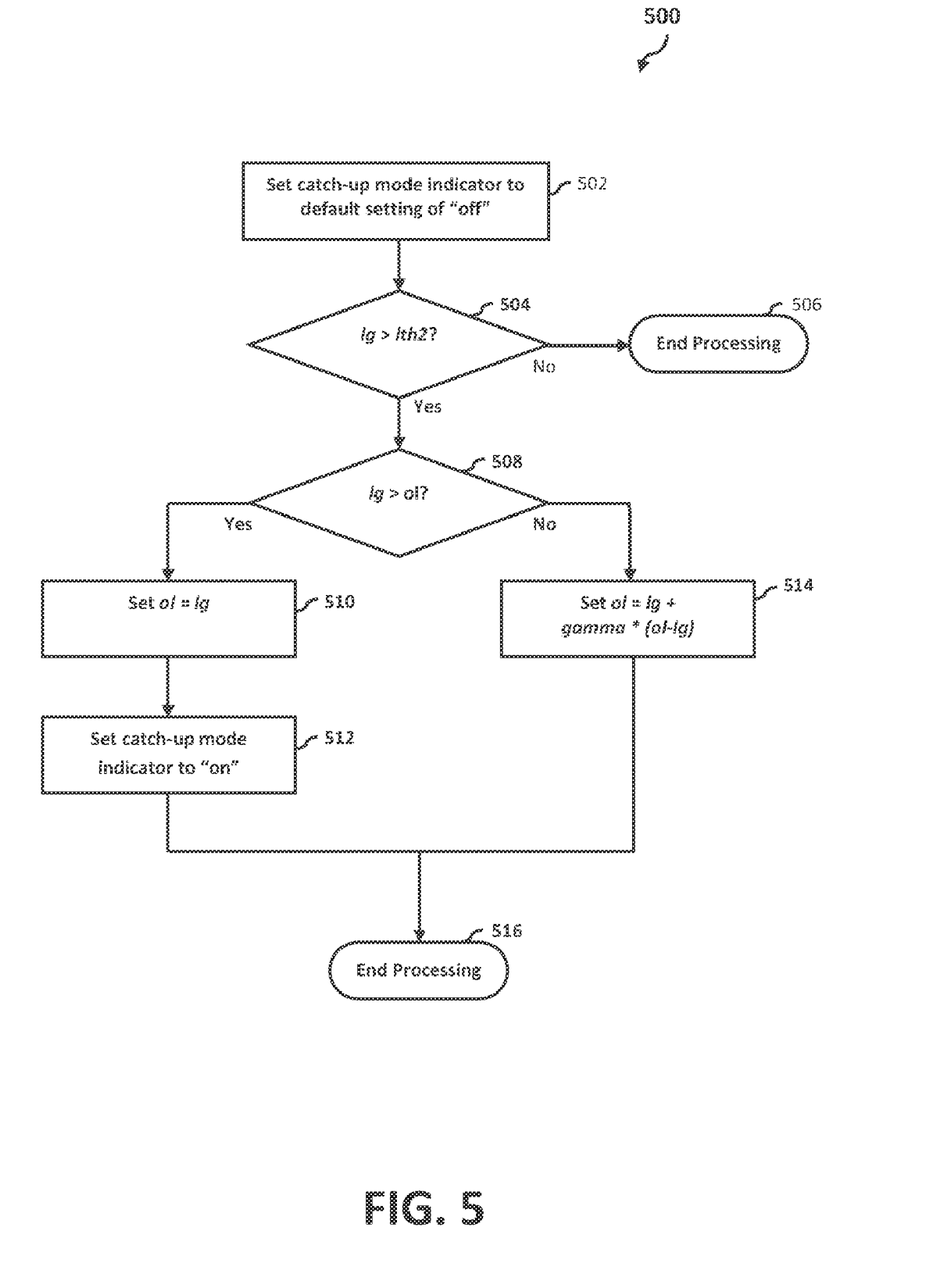
FIG. 5 depicts a flowchart of a method for calculating an estimated long term signal level in accordance with an embodiment of the present invention.

As shown in FIG. 5, the algorithm begins at step 502, in which signal level estimator 130 sets the catch-up mode indicator to a default setting of "off." At decision step 504, signal level estimator 130 determines if lg is greater than lth2. If lg is not greater than lth2, then processing ends at step 506 and a new signal level estimate is not generated (in other words, ol retains its current value). If, however, lg is greater than lth2, then processing proceeds to decision step 508.

At decision step 508, signal level estimator 130 determines if lg is greater than ol. If lg is greater than ol, then signal level estimator 130 sets ol equal to lg as shown at step 510 and sets the catch-up mode indicator to "on," as shown at step 512. If, however, lg is not greater than ol, then signal level estimator sets ol equal to lg+gamma*(ol−lg), as shown at step 514. After step 512 or 514 has completed, processing ends as shown at step 516.

In accordance with the foregoing algorithm, the attenuation factor gamma controls the speed at which the output level ol attenuates towards the log-gain lg calculated by average frame power calculator 110 when lg is less than or equal to ol. If the frame size is M ms, and if it is desirable to have the difference of ol−lg decay to a fraction f of the starting difference value of ol−lg within D ms while lg is kept a constant, then the attenuation factor can be chosen as $$\text{gamma} = 10^{\frac{M}{D}\log_{10}f}.$$

4. Gain Determiner 140

As discussed above, gain determiner 140 calculates the target gain that needs to be applied to the current frame to scale the input audio signal to a desired target output level. In accordance with this first implementation of system 100, if the signal level ol associated with the current frame is above L dBFs, system 100 will scale the input audio signal to T dBFs, but if the signal level ol is below L dBFs, system 100 will just apply a fixed (T−L) dB gain to the input audio signal. In this case, gain determiner 140 may be implemented using the algorithm depicted in flowchart 600 of FIG. 6.

Figure 6:
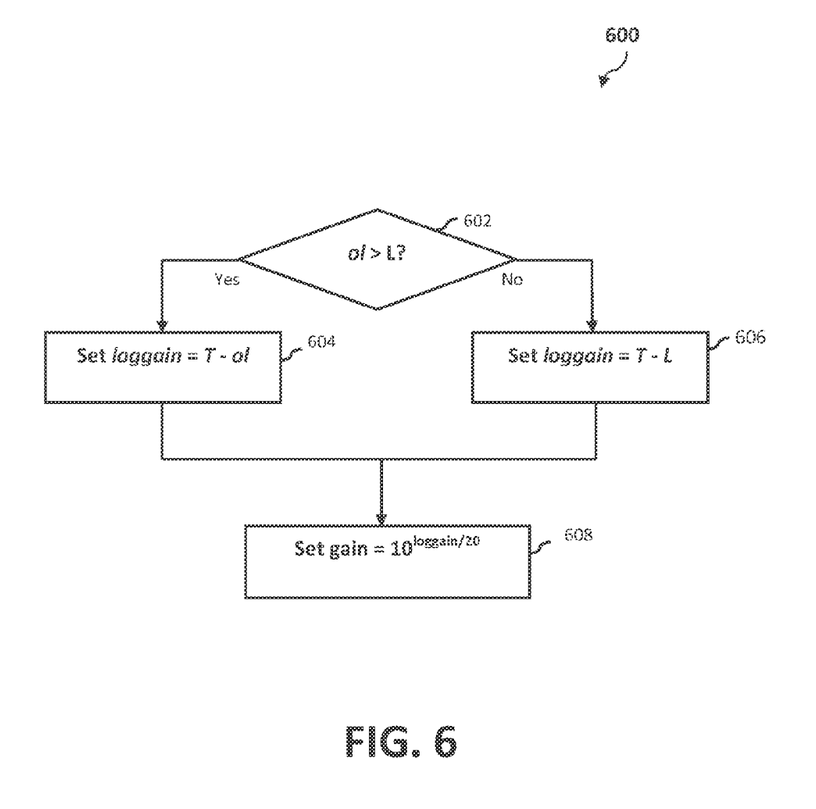
FIG. 6 depicts a flowchart of a method for calculating a gain to be applied to a current frame of an input audio signal to scale the input audio signal to a desired target output level in accordance with an embodiment of the present invention.

As shown in FIG. 6, the algorithm begins at decision step 602, in which gain determiner 140 determines whether ol is greater than L. If ol is greater than L, then gain determiner 140 sets loggain equal to T−ol, as shown at step 604. If, on the other hand, ol is not greater than L, then gain determiner 140 sets loggain equal to T−L, as shown at step 606. After step 604 or step 606 has completed, gain determiner 140 sets gain equal to $10^{loggain/20}$, as shown at step 608. Suitable parameter values in accordance with this example are L=−24 dBFs and T=−18 dBFs.

5. Gain Ramp Generator 150

In further accordance with this first example implementation of system 100, gain ramp generator 150 uses the output gain from gain determiner 140 and the catch-up mode indicator to determine an appropriate shape for the gain ramp. The gain ramp basically transitions from the value of the variable gain associated with the last frame that was processed by system 100, called lastgain, to the value of the variable gain associated with the current frame. When system 100 starts up, the variable lastgain is initialized to 1. Gain ramp generator 150 may then be implemented as follows.

If the catch-up mode indicator is set to "off," then the current frame is not in the catch-up mode. In this case, the gain ramp is generated using a linear function that starts at the value of lastgain and then linearly changes to the value of gain over the course of most or all of an entire frame, such as over the course most or all of an entire 20 ms frame. If, on the other hand, the catch-up mode indicator is set to "on," then the current frame is in the catch-up mode and gain is less than lastgain. In this case, the gain ramp starts at the value of lastgain and then decreases linearly to the value of gain over a very short time frame, such as for example, 0.5 ms or 1 ms when the frame is 20 ms in length. The ramp then stays at a constant value of gain for the remainder of the frame. Once the gain ramp has been determined, the gain for the last frame is updated as lastgain=gain.

6. Gain Ramp Applier 160

In accordance with this first implementation of system 100, gain ramp applier 160 simply applies the gain ramp generated by gain ramp generator 150 on a sample-by-sample basis to the input audio signal in the current frame to obtain the output audio signal for the current frame. In other words, if x(n), g(n), and y(n) are the n-th sample of the input audio signal, the gain ramp, and the output audio signal, respectively, then gain ramp applier 160 performs the following operation:

$$y(n)=x(n)g(n),$$

for n=1, 2, ..., FRSZ, where FRSZ is the frame size, or the number of samples in a frame.

C. Second Example Implementation Details

The first example implementation of system 100 described above has the advantage of being simple and having a low computational complexity. For certain applications where low complexity is desired and performance requirements are not very demanding, this first example implementation is a good choice. However, it achieves automatic volume control by making decisions based on average power calculated over only a single frame, which is 16 ms in the exemplary embodiment described above. Such a short duration for the average power calculation often does not correspond well with the human auditory perception of loudness, which sometimes requires a longer "integration time." Yet, simply increasing the frame size may not be an optimal solution as it will increase the memory or storage requirements significantly and will reduce the frequency at which samples are taken of average power, thus making the system less responsive.

A second example implementation of system 100 described below attempts to maintain the perceived loudness of the output audio signal more constant as compared with the first example implementation, and yet does not require a much greater memory size. The second example implementation is still based on the block diagram of system 100 of FIG. 1. It builds upon the foundation of the first example implementation described above but improves the performance. The following description of the second example implementation of system 100 will focus mainly on the differences from the first example implementation. Gain determiner 140, gain ramp generator 150 and gain ramp applier 160 will not be described as they operate in substantially the same manner in the second example implementation as in the first example implementation.

1. Average Frame Power Calculator 110

In the second example implementation, average frame power calculator 110 is modified to increase the time resolution for detecting the onset of an active signal from silence. In the first example implementation described above, average frame power calculator 110 scans the current frame of the input audio signal one subframe at a time from the beginning of the current frame to the end of the current frame and identifies the first active subframe (that is, the first subframe having a signal energy that exceeds the first power threshold calculated by power threshold calculator 120). In the second example implementation, after the first active subframe is detected, average frame power calculator 110 further scans every input audio signal sample in the first active subframe, from the first sample of the subframe to the last sample of the subframe, and identifies the first active sample that exceeds a magnitude threshold. The magnitude threshold is the square root of the first power threshold produced by power threshold calculator 120.

Average frame power calculator 110 then determines the total number of samples from the first active sample in the first active subframe to the last sample in the current frame. The result is the number of active samples in the current frame, or the length of the active signal in the current frame, denoted l. Average frame power calculator 110 then computes the total energy of the active signal samples in the current frame, and divides this total energy by l. The result of such a division is pwr, the average power of the active portion of the input audio signal, accurate to the sample.

In addition to using frames, the second example implementation uses a "super-frame," which consists of N frames, starting from the (N−1)-th frame before the current frame and ending at the current frame. An exemplary value of N is 20, although a suitable value of N may be anywhere from 10 to 20. These examples are not intended to be limiting however and other values of N may be used. If the frame size is 16 ms, then a super-frame with 20 frames will have a super-frame size of 320 ms.

In the second example implementation, in addition to calculating the average power pwr for the current frame, average frame power calculator 110 also calculates the average power for the active signal portion of the super-frame. For the current frame and the previous N−1 frames that are in the current super-frame, average power calculator 110 maintains a buffer of N average frame power values and another buffer of N lengths of active signals, one for each frame in the super-frame. When a new set of pwr and l values are calculated for the current frame, average frame power calculator 110 shifts the two N-element arrays by one (shifting out the oldest frame) and writes the newest pwr and l values into the locations in the two N-element arrays corresponding to the current frame.

Using these two N-element arrays, average frame power calculator 110 sums up the energy of the active portion of the input audio signal in each of the N frames within the current super-frame, and it also sums up the lengths of active signals for all N frames within the current super-frame. Then, it divides the resulting total energy by the total length of the active signal to obtain pwrsf, the average power for the active signal of the current super-frame. This average power for the super-frame is then converted to the dBFs scale in the logarithmic domain:

$$lgsf=10\log_{10}(pwrsf)-R.$$

A potential additional enhancement to average frame power calculator 110 is to add one or more frames of the so-called "look-ahead" so that average frame power calculator 110 can make a better decision by being able to "peek" into the future frame(s). However, this comes at the price of additional delay because the output frame will be delayed relative to the input frame by the amount of the look-ahead.

2. Power Threshold Calculator 120

In accordance with the second example implementation, after average frame power calculator 110 calculates lgsf, power threshold calculator 120 updates the two power thresholds in the same way as in the first example implementation described above, except that this time lgsf, the log-gain of the current super-frame, is used in place of lg, the log-gain for the current frame. Specifically, power threshold calculator now operates according to the algorithm depicted in flowchart 700 of FIG. 7.

Figure 7:
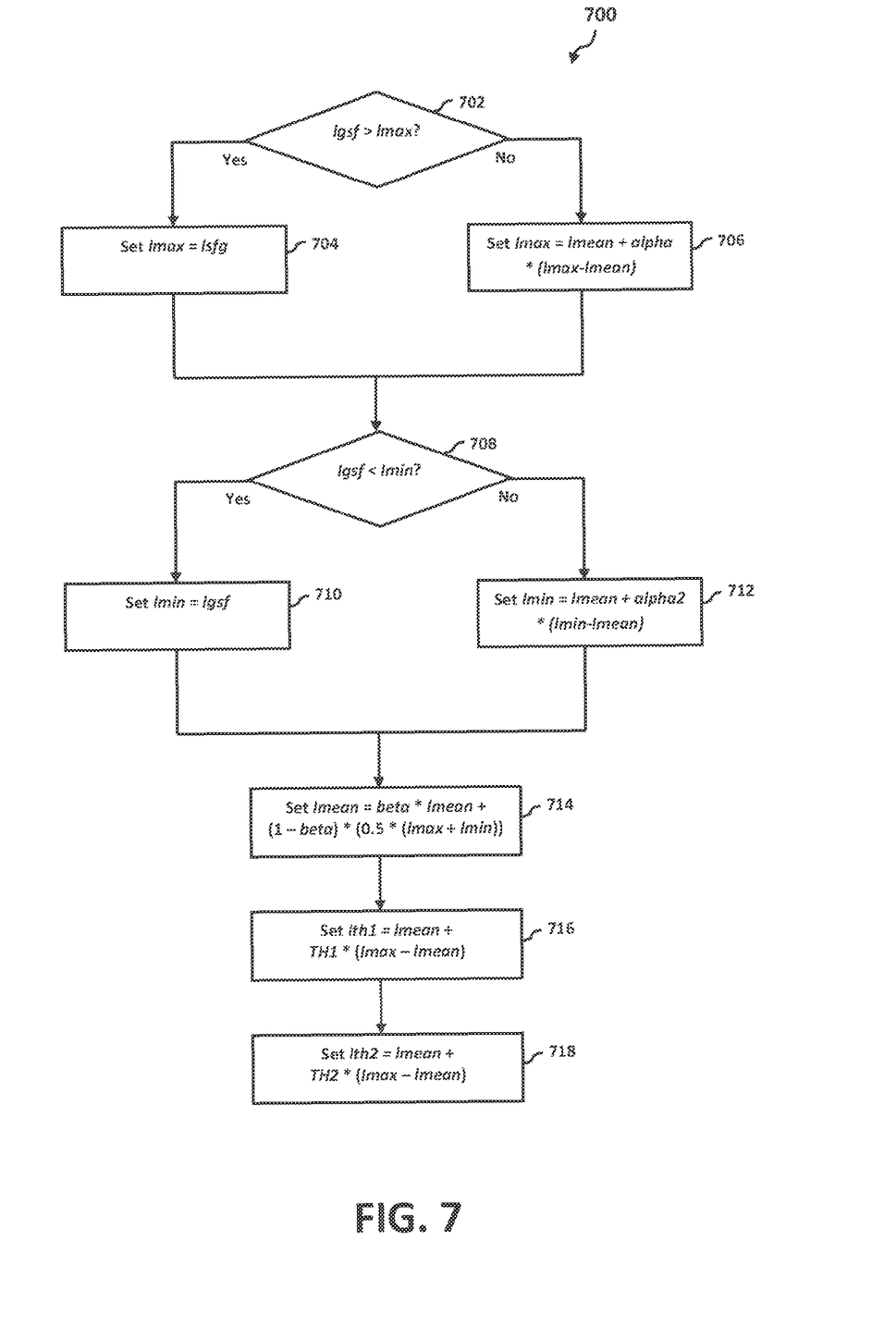
FIG. 7 depicts a flowchart of a method for updating first and second power thresholds in accordance with an alternative embodiment of the present invention

As shown in FIG. 7, the algorithm begins at decision step 702, in which power threshold calculator 120 determines whether lgsf is greater than lmax. If lgsf is greater than lmax, then power threshold calculator 120 sets lmax equal to lgsf, as shown at step 704. If, on the other hand, lgsf is not greater than lmax, then power threshold calculator 120 sets lmax equal to lmean+alpha*(lmax−lmean), as shown at step 706.

At decision step 708, power threshold calculator 120 determines whether lgsf is less than lmin. If lgsf is less than lmin, then power threshold calculator 120 sets lmin equal to lgsf, as shown at step 710. If, on the other hand, lgsf is not less than lmin, then power threshold calculator 120 sets lmin equal to lmean+alpha2*(lmin−lmean), as shown at step 712.

At step 714, power threshold calculator 120 sets lmean equal to beta*lmean+(1−beta)*(0.5*(lmax+lmean)). At step 716, power threshold calculator 120 sets the first log-gain power threshold, lth1, equal to lmean+TH1*(lmax−lmean). At step 718, power threshold calculator 120 sets the second log-gain power threshold, lth2, equal to lmean+TH2*(lmax−lmean).

3. Signal Level Estimator 130

In the second example implementation, signal level estimator 130 operates in substantially the same manner as in the first example implementation, except that lg is now replaced by lgsf. Specifically, signal level estimator 130 now operates according to the algorithm depicted in flowchart 800 of FIG. 8.

Figure 8:
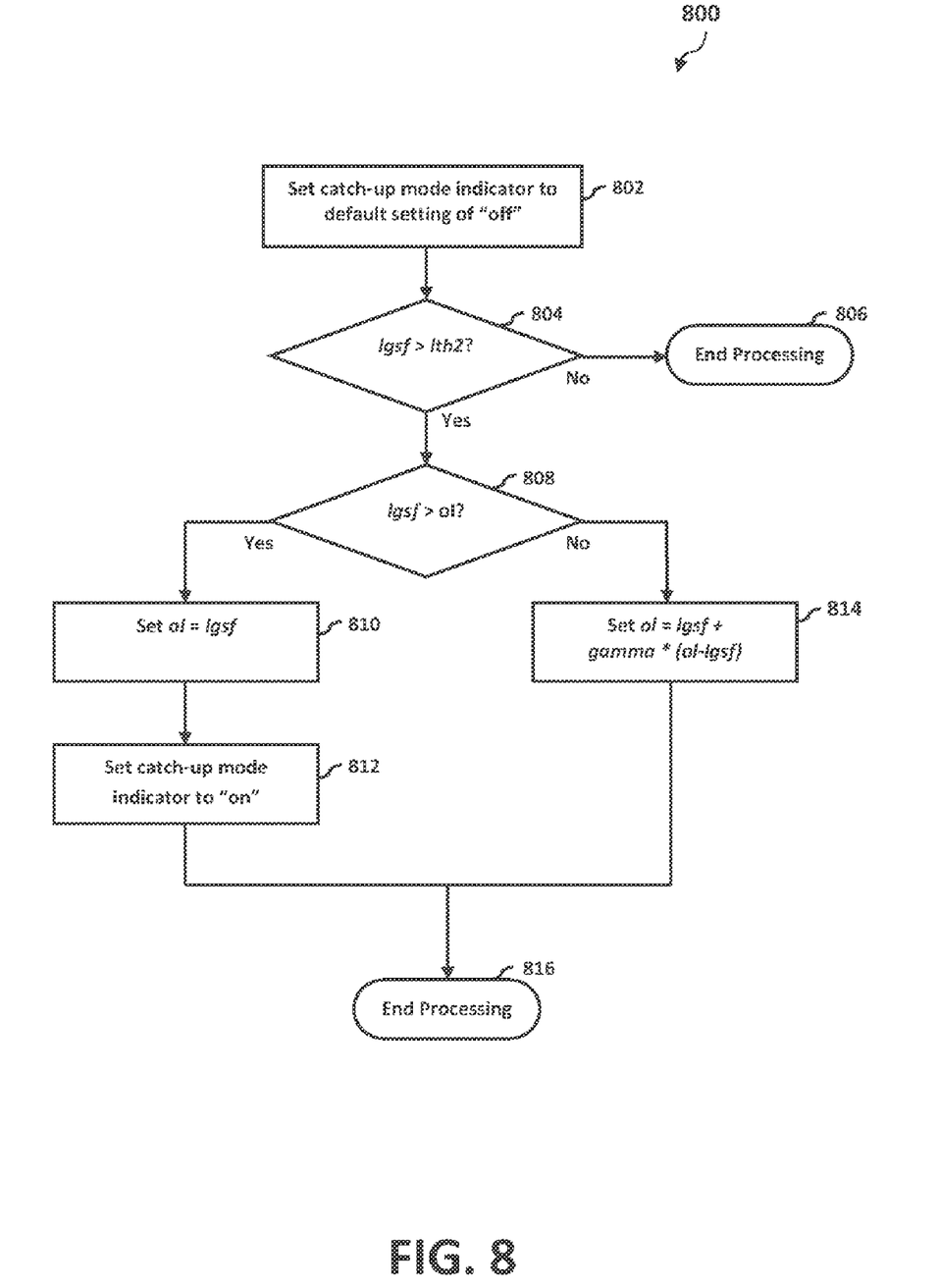
FIG. 8 depicts a flowchart of a method for calculating an estimated long term signal level in accordance with an alternative embodiment of the present invention

As shown in FIG. 8, the algorithm begins at step 802, in which signal level estimator 130 sets the catch-up mode indicator to a default setting of "off." At decision step 804, signal level estimator 130 determines if lgsf is greater than lth2. If lgsf is not greater than lth2, then processing ends at step 806 and a new signal level estimate is not generated (in other words, ol retains its current value). If, however, lgsf is greater than lth2, then processing proceeds to decision step 808.

At decision step 808, signal level estimator 130 determines if lgsf is greater than ol. If lgsf is greater than ol, then signal level estimator 130 sets ol equal to lgsf as shown at step 810 and sets the catch-up mode indicator to "on," as shown at step 812. If, however, lgsf is not greater than ol, then signal level estimator sets ol equal to lgsf+gamma*(ol−lgsf), as shown at step 814. After step 812 or 814 has completed, processing ends as shown at step 816.

D. Example Hardware and Software Implementations

Figure 9:
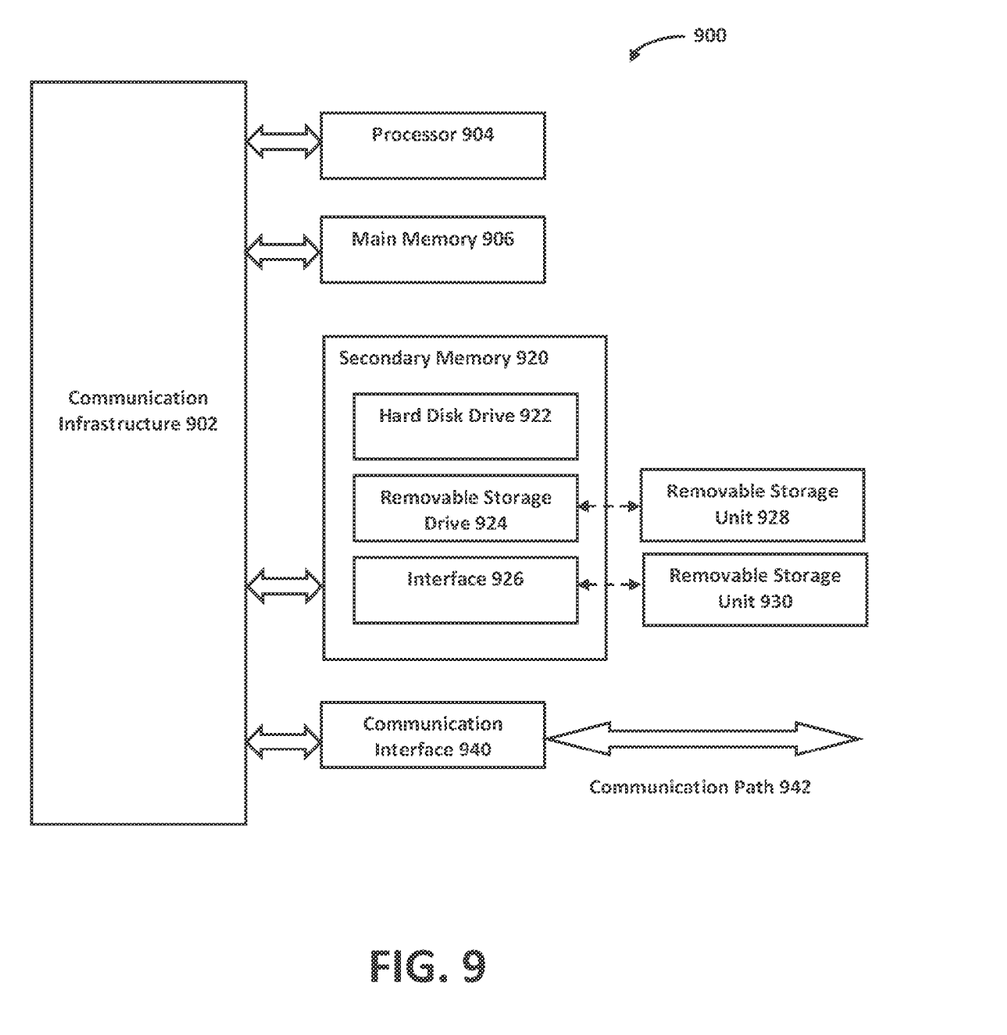
FIG. 9 is a block diagram of an example computer system that may be used to implement an embodiment of the present invention.

The following description of a general purpose computer system is provided for the sake of completeness. The present invention can be implemented in hardware, or as a combination of software and hardware. Consequently, the invention may be implemented in the environment of a computer system or other processing system. An example of such a computer system 900 is shown in FIG. 9. In the present invention, all of the processing blocks or steps of FIGS. 1-8, for example, can execute on one or more distinct computer systems 900, to implement the various methods of the present invention. The computer system 900 includes one or more processors, such as processor 904. Processor 904 can be a special purpose or a general purpose digital signal processor. The processor 904 is connected to a communication infrastructure 902 (for example, a bus or network). Various software implementations are described in terms of this exemplary computer system. After reading this description, it will become apparent to a person skilled in the relevant art(s) how to implement the invention using other computer systems and/or computer architectures.

Computer system 900 also includes a main memory 906, preferably random access memory (RAM), and may also include a secondary memory 920. The secondary memory 920 may include, for example, a hard disk drive 922 and/or a removable storage drive 924, representing a floppy disk drive, a magnetic tape drive, an optical disk drive, or the like. The removable storage drive 924 reads from and/or writes to a removable storage unit 928 in a well known manner. Removable storage unit 928 represents a floppy disk, magnetic tape, optical disk, or the like, which is read by and written to by removable storage drive 924. As will be appreciated, the removable storage unit 928 includes a computer usable storage medium having stored therein computer software and/or data.

In alternative implementations, secondary memory 920 may include other similar means for allowing computer programs or other instructions to be loaded into computer system 900. Such means may include, for example, a removable storage unit 930 and an interface 926. Examples of such means may include a program cartridge and cartridge interface (such as that found in video game devices), a removable memory chip (such as an EPROM, or PROM) and associated socket, and other removable storage units 930 and interfaces 926 which allow software and data to be transferred from the removable storage unit 930 to computer system 900.

Computer system 900 may also include a communications interface 940. Communications interface 940 allows software and data to be transferred between computer system 900 and external devices. Examples of communications interface 940 may include a modem, a network interface (such as an Ethernet card), a communications port, a PCMCIA slot and card, etc. Software and data transferred via communications interface 940 are in the form of signals which may be electronic, electromagnetic, optical, or other signals capable of being received by communications interface 940. These signals are provided to communications interface 940 via a communications path 942. Communications path 942 carries signals and may be implemented using wire or cable, fiber optics, a phone line, a cellular phone link, an RF link and other communications channels.

As used herein, the terms "computer program medium" and "computer usable medium" are used to generally refer to media such as removable storage units 928 and 930, a hard disk installed in hard disk drive 922, and signals received by communications interface 940. These computer program products are means for providing software to computer system 900.

Computer programs (also called computer control logic) are stored in main memory 906 and/or secondary memory 920. Computer programs may also be received via communications interface 940. Such computer programs, when executed, enable the computer system 900 to implement the present invention as discussed herein. In particular, the computer programs, when executed, enable the processor 900 to implement the processes of the present invention, such as any of the methods described herein. Accordingly, such computer programs represent controllers of the computer system 900. Where the invention is implemented using software, the software may be stored in a computer program product and loaded into computer system 900 using removable storage drive 924, interface 926, or communications interface 940.

In another embodiment, features of the invention are implemented primarily in hardware using, for example, hardware components such as Application Specific Integrated Circuits (ASICs) and gate arrays. Implementation of a hardware state machine so as to perform the functions described herein will also be apparent to persons skilled in the relevant art(s).

F. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims.

For example, the present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A method for automatically controlling the volume of an audio signal, comprising:
   calculating an average power associated with a segment of an input audio signal;
   determining whether the average power is greater than an estimated signal level associated with one or more previously-processed segments of the input audio signal;
   responsive to determining that the average power is not greater than the estimated signal level, calculating an updated estimated signal level by subtracting from the average power an attenuated difference between the estimated signal level and the average power;
   responsive to determining that the average power is greater than the estimated signal level, setting the updated estimated signal level equal to the average power; and
   determining a gain to be applied to the segment of the input audio signal based on the updated estimated signal level and a target signal level for an output audio signal.

2. The method of claim 1, wherein calculating an average power associated with a segment of the input audio signal comprises:
   calculating an average power associated with a single frame of the input audio signal.

3. The method of claim 2, wherein calculating an average power associated with a single frame of the input audio signal comprises:
   calculating an average power associated only with subframes within the single frame of the input audio signal that are determined to be active.

4. The method of claim 3, further comprising:
   determining which subframes within the single frame of the input audio signal are active by comparing a signal energy associated with each subframe to a power threshold.

5. The method of claim 4, further comprising:
   adaptively adjusting the power threshold responsive to a change in the level of the input audio signal.

6. The method of claim 1, wherein calculating an average power associated with a segment of the audio signal comprises:
   calculating an average power associated with a plurality of frames of the input audio signal.

7. The method of claim 6, wherein calculating an average power associated with a plurality of frames of the input audio signal comprises:
   calculating an average power associated only with samples that are determined to be active within the plurality of frames of the input audio signal.

8. The method of claim 1, further comprising:
   determining if the average power exceeds a power threshold;
   responsive to determining that the average power does not exceed the power threshold, determining the gain to be applied to the segment of the input audio signal based on the estimated signal level associated with the one or more previously-processed segments of the input audio signal and the target signal level for an output audio signal.

9. The method of claim 8, further comprising:
   adaptively adjusting the power threshold responsive to a change in the level of the input audio signal.

10. The method of claim 1, further comprising:
    generating a series of gain values that transition from the gain associated with the previously-processed segment of the input audio signal to the determined gain; and
    applying the series of gain values to the segment of the input audio signal.

11. The method of claim 10, wherein generating a series of gain values comprises:
    generating a series of gain values that transition from the gain associated with the previously-processed segment of the input audio signal to the determined gain in a first time period responsive to a determination that the average power is less than or equal to the estimated signal level; and
    generating a series of gain values that transition from the gain associated with the previously-processed segment of the input audio signal to the determined gain in a second time period responsive to a determination that the average power is greater than the estimated signal level;
    wherein the first time period is longer than the second time period.

12. A system for automatically controlling the volume of an audio signal, comprising:
    an average segment power calculator configured to calculate an average power associated with a segment of an input audio signal;
    a signal level estimator configured to determine whether the average power is greater than an estimated signal level associated with one or more previously-processed segments of the input audio signal, to calculate an updated estimated signal level by subtracting from the average power an attenuated difference between the estimated signal level and the average power responsive to a determination that the average power is not greater than the estimated signal level, and to set the updated estimated signal level equal to the average power responsive to a determination that the average power is greater than the estimated signal level; and a gain determiner configured to determine a gain to be applied to the segment of the input audio signal based on the updated estimated signal level and a target signal level for an output audio signal.

13. The system of claim 12, wherein the average segment power calculator is configured to calculate an average power associated with a single frame of the input audio signal.

14. The system of claim 13, wherein the average segment power calculator is configured to calculate an average power associated only with subframes within the single frame of the input audio signal that are determined to be active.

15. The system of claim 14, wherein the average segment power calculator is further configured to determine which subframes within the single frame of the input audio signal are active by comparing a signal energy associated with each subframe to a power threshold.

16. The system of claim 15, further comprising:
a power threshold calculator configured to adaptively adjust the power threshold responsive to a change in the level of the input audio signal.

17. The system of claim 12, wherein the average segment power calculator is configured to calculate an average power associated with a plurality of frames of the input audio signal.

18. The system of claim 17, wherein the average segment power calculator is configured to calculate an average power associated only with samples that are determined to be active within the plurality of frames of the input audio signal.

19. The system of claim 12, wherein the signal level estimator is further configured to determine if the average power exceeds a power threshold and to determine the gain to be applied to the segment of the input audio signal based on the estimated signal level associated with the one or more previously-processed segments of the input audio signal and the target signal level for an output audio signal responsive to determining that the average power does not exceed the power threshold.

20. The system of claim 19, further comprising:
a power threshold calculator configured to adaptively adjust the power threshold responsive to a change in the level of the input audio signal.

21. The system of claim 12, further comprising:
a gain ramp generator configured to generate a series of gain values that transition from the gain associated with the previously-processed segment of the input audio signal to the determined gain; and
a gain ramp applier configured to apply the series of gain values to the segment of the input audio signal.

22. The system of claim 21, wherein the gain ramp generator is configured to generate a series of gain values that transition from the gain associated with the previously-processed segment of the input audio signal to the determined gain in a first time period responsive to a determination that the average power is less than or equal to the estimated signal level and to generate a series of gain values that transition from the gain associated with the previously-processed segment of the input audio signal to the determined gain in a second time period responsive to a determination that the average power is greater than the estimated signal level; wherein the first time period is longer than the second time period.

23. A computer program product comprising a computer-readable medium having computer program logic recorded thereon for enabling a processor to automatically control the volume of an audio signal, wherein the computer program logic comprises:
first means for enabling the processor to calculate an average power associated with a segment of an input audio signal;
second means for enabling the processor to determine whether the average power is greater than an estimated signal level associated with one or more previously-processed segments of the input audio signal;
third means for enabling the processor to calculate an updated estimated signal level by subtracting from the average power an attenuated difference between the estimated signal level and the average power responsive to a determination that the average power is not greater than the estimated signal level;
fourth means for enabling the processor to set the updated estimated signal level equal to the average power responsive to a determination that the average power is greater than the estimated signal level; and
fifth means for enabling the processor to determine a gain to be applied to the segment of the input audio signal based on the updated estimated signal level and a target signal level for an output audio signal.

24. The computer program product of claim 23, wherein the first means comprises means for enabling the processor to calculate an average power associated with a single frame of the input audio signal.

25. The computer program product of claim 24, wherein the first means comprises means for enabling the processor to calculate an average power associated only with subframes within the single frame of the input audio signal that are determined to be active.

26. The computer program product of claim 25, wherein the first means further comprises means for enabling the processor to determine which subframes within the single frame of the input audio signal are active by comparing a signal energy associated with each subframe to a power threshold.

27. The computer program product of claim 26, wherein the computer program logic further comprises:
means for enabling the processor to adaptively adjust the power threshold responsive to a change in the level of the input audio signal.

28. The computer program product of claim 23, wherein the first means comprises means for enabling the processor to calculate an average power associated with a plurality of frames of the input audio signal.

29. The computer program product of claim 28, wherein the first means comprises means for enabling the processor to calculate an average power associated only with samples that are determined to be active within the plurality of frames of the input audio signal.

30. The computer program product of claim 23, wherein the computer program logic further comprises:
means for enabling the processor to determine if the average power exceeds a power threshold; and
means for enabling the processor to determine the gain to be applied to the segment of the input audio signal based on the estimated signal level associated with the one or more previously-processed segments of the input audio signal and the target signal level for an output audio signal responsive to determining that the average power does not exceed the power threshold.

31. The computer program product of claim 30, wherein the computer program logic further comprises:
   means for enabling the processor to adaptively adjust the power threshold responsive to a change in the level of the input audio signal.

32. The computer program product of claim 23, wherein the computer program logic further comprises:
   means for enabling the processor to generate a series of gain values that transition from the gain associated with the previously-processed segment of the input audio signal to the determined gain; and
   means for enabling the processor to apply the series of gain values to the segment of the input audio signal.

33. The computer program product of claim 32, wherein the means for enabling the processor to generate a series of gain values comprises:
   means for enabling the processor to generate a series of gain values that transition from the gain associated with the previously-processed segment of the input audio signal to the determined gain in a first time period responsive to a determination that the average power is less than or equal to the estimated signal level; and
   means for enabling the processor to generate a series of gain values that transition from the gain associated with the previously-processed segment of the input audio signal to the determined gain in a second time period responsive to a determination that the average power is greater than the estimated signal level;
   wherein the first time period is longer than the second time period.

* * * * *